United States Patent [19]

Fuji

[11] Patent Number: 5,121,036
[45] Date of Patent: Jun. 9, 1992

[54] SEMICONDUCTOR INTEGRATED CIRCUIT WITH PADS AND POWER SUPPLY LINES

[75] Inventor: Yukio Fuji, Tokyo, Japan
[73] Assignee: NEC Corporation, Tokyo, Japan
[21] Appl. No.: 609,543
[22] Filed: Nov. 6, 1990
[30] Foreign Application Priority Data
Nov. 6, 1989 [JP] Japan ................. 1-288414
[51] Int. Cl.$^5$ .................. H03K 3/013; H03K 17/687
[52] U.S. Cl. .................. 307/303; 307/296.1; 357/40
[58] Field of Search .......... 307/296.1, 303, 296.2, 307/443; 357/40, 45, 68

[56] References Cited
U.S. PATENT DOCUMENTS
4,789,796 12/1988 Fioss ................ 307/296.1 X
4,988,894 1/1991 Takiba et al. .......... 307/296.1

Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A semiconductor integrated circuit has an internal circuit, an output circuit, power supply pads and power supply lines for the output circuit, and power supply pads and power supply lines for the internal circuit and a substrate potential pad and a substrate potential supply line for supplying a substrate potential. The power supply pads and power supply lines for the output circuit are separate and independent from the other power supply pads and power supply lines for the internal circuit and for supplying the substrate potential and, as a result, any power supply noise developed at the output circuit is prevented from propagating to other related circuits. This ensures a stable and reliable operation of the semiconductor integrated circuit device in which the present invention is embodied.

3 Claims, 3 Drawing Sheets

SEMICONDUCTOR INTEGRATED CIRCUIT WITH PADS AND POWER SUPPLY LINES

BACKGROUND OF THE INVENTION

The present invention relates to a semiconductor integrated circuit and, more particularly, to a semiconductor integrated circuit having improved power supply pads and power supply lines therein.

Conventional semiconductor integrated circuits of the kind to which the present invention relates are shown in FIGS. 4 and 5 and the full details of such circuits and the problems therein are explained later before the preferred embodiments of the present invention are explained.

FIG. 4 shows, for example, a conventional semiconductor integrated circuit having an internal circuit, a sense amplifier and an output circuit which receive power from an external power supply source through common power supply pads and power supply lines. One of the problems therein is that, since the power supply pads and power supply lines for the output circuit are in common with other power supply pads and power supply lines for the internal circuit and for supplying the substrate potential, a power supply noise developed at the output circuit propagates to other related circuits thereby causing malfunctions.

In the circuit according to the present invention, the propagation of the power supply noise is prevented thereby ensuring a stable and reliable operation of the semiconductor integrated circuit device in which the present invention is embodied.

SUMMARY OF THE INVENTION

It is, therefore, an object of the invention to overcome the problems existing in the conventional circuit device and to provide an improved semiconductor integrated circuit device with pads and power supply lines.

According to one aspect of the present invention, the semiconductor integrated circuit device comprises:
- a set of power supply pads supply pads and set of power supply lines for said output circuit;
- a set of power supply pads and a set of power supply lines for said internal circuit; and
- a substrate potential supply pad and a substrate potential line for supplying a substrate potential;

said power supply pads and said power supply lines for said output circuit being separate and independent from said power supply pads and said power supply lines for said internal circuit and said substrate potential supply pad and said substrate potential supply line for supplying the substrate potential.

In the circuit according to the present invention, the power supply lines for the output circuit is separate and independent from other power supply lines for the internal circuit and the potential supply line for the substrate and, as a result, a power supply noise developed at the output circuit is prevented from propagating to other related circuits. The prevention of malfunctions in internal circuits in the semiconductor device ensures a stable and reliable operation of any systems constituted by the semiconductor device according to the present invention.

BRIEF DESCRIPTION OF THE DRAWINGS

The above and other objects, features and advantages of the present invention will be apparent from the following description of preferred embodiments of the invention with reference to the accompanying drawings, in which.

PREFERRED EMBODIMENTS OF THE INVENTION

Throughout the following explanation, similar reference symbols or numerals refer to the same similar elements in all figures of the drawings.

First, for the purpose of assisting in the understanding of the present invention, the conventional semiconductor integrated circuits of the type to which the present invention relates and problems existing therein are explained with reference to FIGS. 4, 5 and 6.

Figure 4:
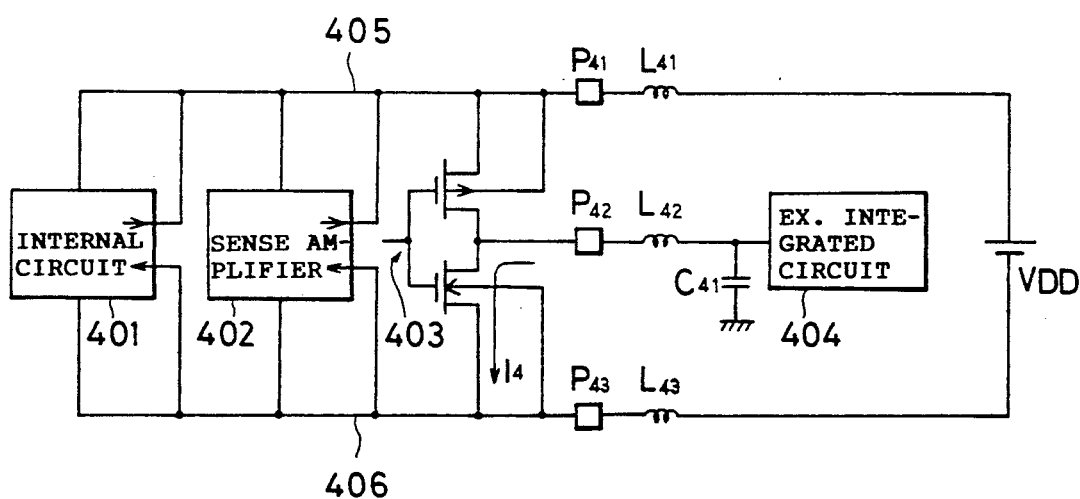
FIGS. 4 and 5 are circuit diagrams of conventional semiconductor integrated circuits.

The conventional semiconductor integrated circuit shown in FIG. 4 includes an internal circuit 401, a sense amplifier 402 and an output circuit 403. They are supplied with power through a set of common power supply pads $P_{41}$, $P_{43}$ and a set of common power supply lines 405, 406 from an external power supply source VDD. Or, as shown in FIG. 5, an internal circuit 501 and a sense amplifier 502 are supplied with power from a set of power supply pads $P_{51}$, $P_{55}$ and a set of power supply lines 505, 506. The output circuit 503 is provided with power through a set of power supply pads $P_{52}$, $P_{54}$ and a set of power supply lines 507, 508 which are separate from the power supply pads $P_{51}$, $P_{55}$ and the power supply lines 505, 506.

Figure 5:
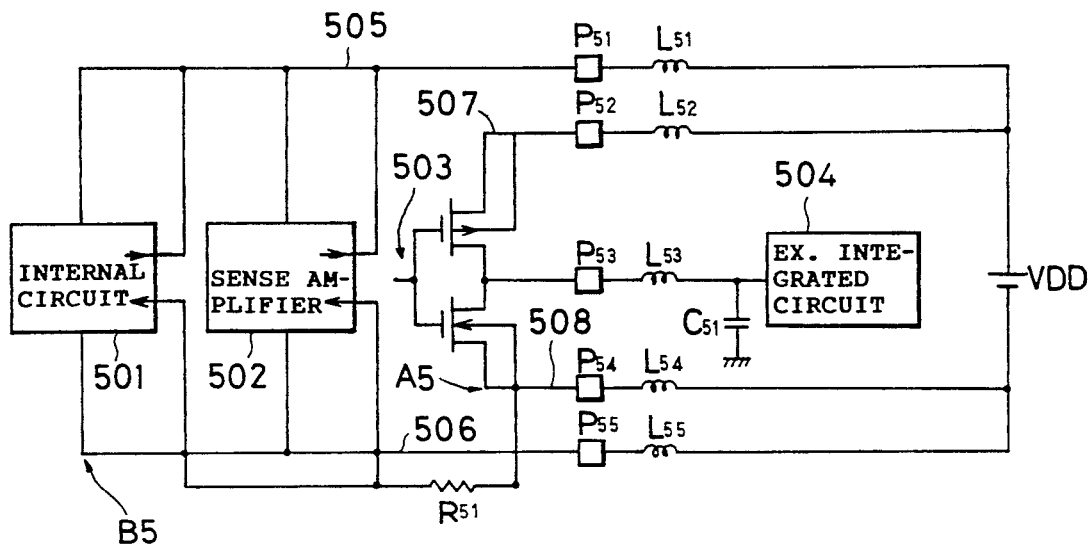
Figure 6:
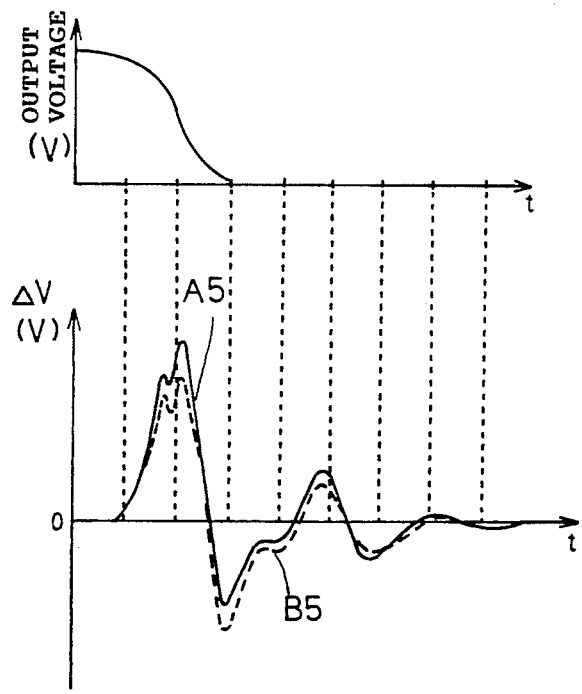
FIG. 6 is a diagram illustrating the state of operation of the conventional circuit shown in FIG. 5.

As shown in FIGS. 4 and 5, there is an external integrated circuit 404/504 which receives an output signal from the output circuit 403/503 through the pad $P_{42}/P_{53}$. The output circuit 403/503 has a load capacitance $C_{41}/C_{51}$ and a parasitic inductance $L_{41}$-$L_{43}/L_{51}$-$L_{55}$ in bonding wires or leads of lead frames.

In the conventional arrangement shown in FIG. 4, the output circuit 403 for driving the external integrated circuit 404 is required to change or discharge a charge of large load capacitance $C_{41}$. When the output circuit 403 discharges a charge of large load capacitance $C_{41}$, a large current $I_4$ flows to the power supply line 406 through the output circuit 403. Thus, due to the parasitic inductance $L_{43}$ of the power supply circuit, the potential of the line 406 rises by $$\Delta V = L_{43} \cdot dI_4/dt$$

and this becomes a power supply noise. In a situation where there exists within the integrated circuit a circuit such as a sense amplifier circuit which is to detect a minute potential change or which is to respond to a minute changes in an input potential, since the power supply lines in such a circuit are in common with those for the output circuit, the threshold level of such a sense amplifier circuit changes due to the noise $\Delta V$ explained above, thereby causing such sense amplifier circuit to develop malfunctions.

The arrangement shown in FIG. 5 is of an attempt to overcome the above problem in that the power supply pads and the power supply lines for the internal circuit and the sense amplifier are provided separately from those for the output circuit. However, since a power supply line 508 connected to the output circuit 508 is in common with a substrate potential supplying line of an output transistor, the power supply noise as explained above propagates also to the related substrates. In the internal circuit 501 and the sense amplifier 502, too, the power supply line 506 of the transistor supplies a potential to the substrates of transistors for the internal circuit and the sense amplifier. In transistors in general, the structural arrangements dictate that all substrates of transistors of the same kind are provided on the common substrate. Thus, it follows that the power supply line 508 for the output circuit 503 is connected with the power supply line 506 for the internal circuit 501 and the sense amplifier 502 through a substrate resistance $R_{51}$. Consequently, the noise generated at a source of the output circuit 503 and the power supply line 508 is transmitted to the substrate of the output circuit 503 and to further the substrate of the internal circuit 501 and the sense amplifier 502 through the substrate resistance $R_{51}$. The resultant substrate potential is further transmitted to the power supply lines for the internal circuit 501 and the sense amplifier 502. FIG. 6 shows this state by illustrating potential changes with time developed when the potential of the output circuit changes from its High to Low, that is, the potential changes with time which have taken place at point $A_5$ of the power supply line 508 for the output circuit 503 when the charge charged in the load capacitance $C_{51}$ is discharged and the potential changes with time which have taken place at point $B_5$ of the power supply line 506 for the internal circuit 501 and the sense amplifier 502. It is noted from this illustration that the potential changes with time at the point $B_5$ are similar to those at the point $A_5$.

As explained above, in the conventional circuit shown in FIG. 5, too, the noise generated at the output circuit is transmitted to the internal circuit through the substrate in which the circuit is formed, thereby causing fluctuations in the input level of the internal circuit and in the threshold level of the sense amplifier resulting in the occurrence of malfunctions in the related circuits.

The semiconductor circuit device according to the present invention is distinguished from the conventional ones explained above in that the power supply lines for the output circuit are provided separately from the substrate potential supply line and also that the power supply lines for the output circuit are provided separately from those for the internal circuits.

Now, some preferred embodiments of the present invention are explained in detail with reference to the accompanying drawings.

Figure 1:
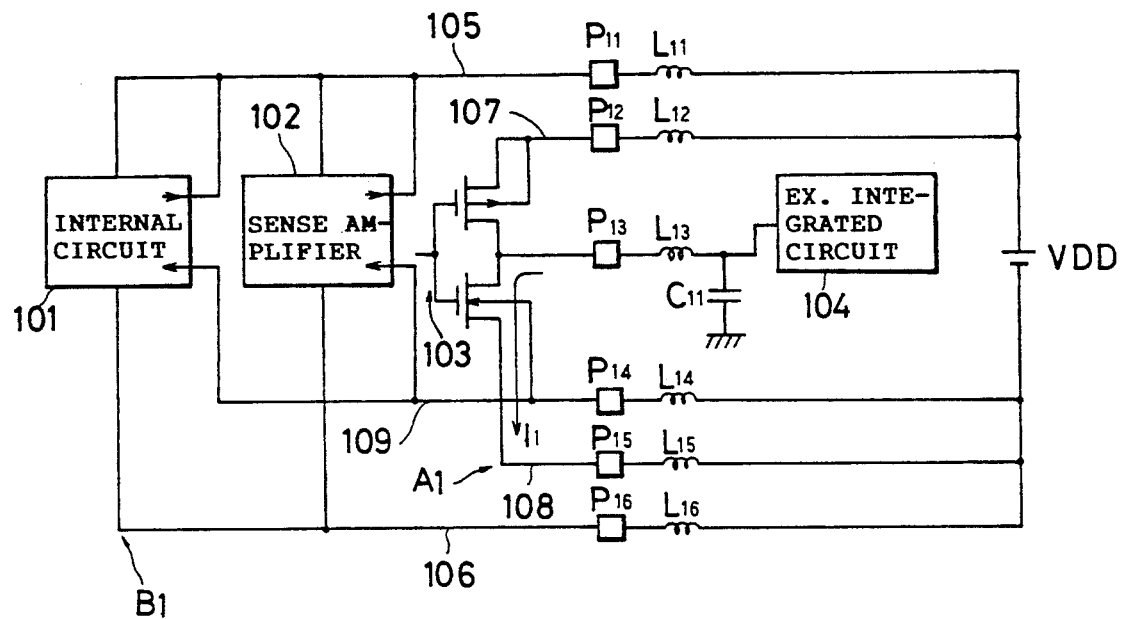
FIG. 1 is a circuit diagram of a semiconductor integrated circuit as a first embodiment according to the present invention.

FIG. 1 shows, in a circuit diagram, one embodiment of the present invention. As shown in FIG. 1, formed within the integrated circuit device are an internal circuit 101, a sense amplifier 102 and an output circuit 103. The output circuit 103 receives a supply of power from a power source VDD through a set of power supply pads $P_{12}$, $P_{15}$ and a set of power supply lines 107, 108. The internal circuit 101 and the sense amplifier 102 receive a supply of power through a set of pads $P_{11}$, $P_{16}$ and a set of power supply lines 105, 106, both the sets being provided separately from the power supply pads $P_{12}$, $P_{15}$ and the power supply lines 107, 108 for the output circuit 103. The substrate potential is provided through a pad $P_{14}$ and a substrate potential line 109 which are separate again from the those pads and power supply lines mentioned above, namely, the pads $P_{11}$, $P_{16}$, $P_{15}$ and the power supply lines 105, 106, 107, 108. The output circuit 103 drives an external integrated circuit 104 having a load capacitance $C_{11}$ through a pad $P_{13}$. Respective parasitic inductances in bonding wires and leads of the lead frames are shown by $L_{11}$-$L_{16}$.

When the output circuit 103 operates to discharge the charge charged in the load capacitance $C_{11}$, the current $I_1$ flows to the power supply line 108. Here, there is developed in the power supply line 108 the power supply noise by the amount $$\Delta V = L_{15} \cdot dI_1/dt.$$

Figure 2:
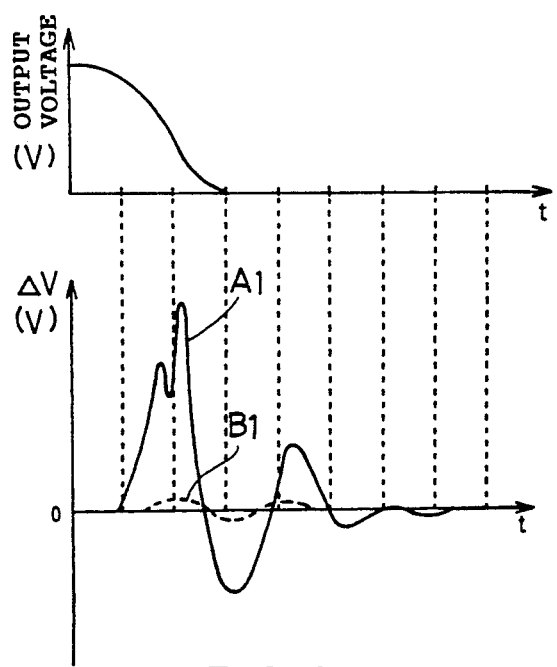
FIG. 2 is a diagram illustrating the state of operation of the circuit shown in FIG. 1.

FIG. 2 shows this state by illustrating the potential changes with time to take place at point $A_1$ of the power supply line 108 for the output circuit 103 and the potential changes with time to take place at point $B_1$ of the power supply line 106 for the internal circuit 101 and the sense amplifier 102. It is noted from this illustration that, although the potential change at the point $A_1$ is large, that at the point $B_1$ is small and this is because the power supply line 108 is provided separately and independently from the power supply line 106 for the internal circuit 101 and the substrates potential supply line 109 for supplying the substrate potential. Consequently, the potential change at the point $B_1$ is substantially with no influence from the output circuit 103. Thus, the noise occurring at the output circuit 103 does not cause the fluctuations in the input level of the internal circuit 101 and in the threshold level of the sense amplifier 102, so that there is no likelihood of the occurrence of malfunctions in the sence amplifier and other related circuits.

Figure 3:
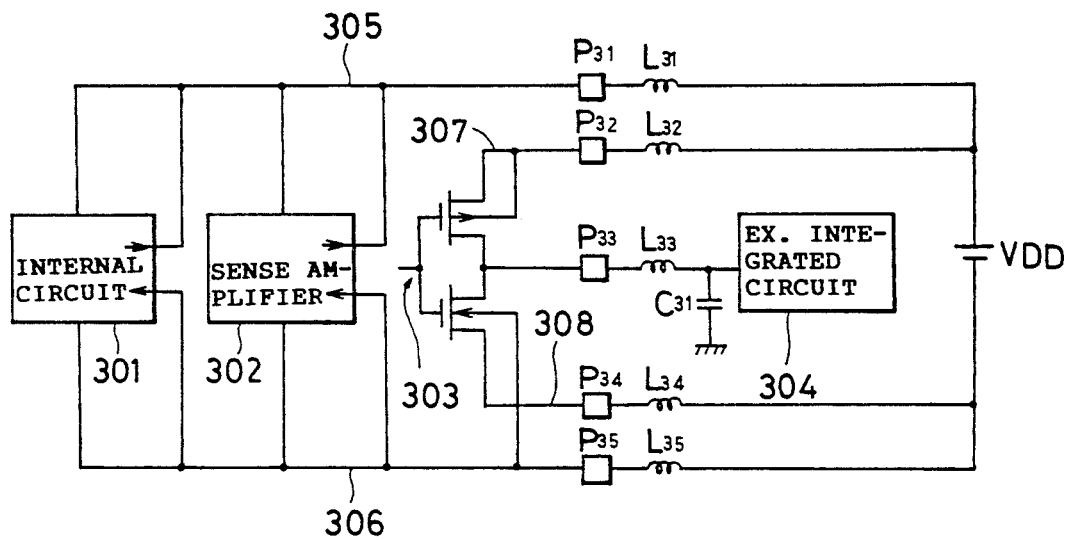
FIG. 3 is a circuit diagram of another embodiment according to the present invention.

FIG. 3 shows, in a circuit diagram, another embodiment according to the present invention. As shown in FIG. 3, there are an internal circuit 301, a sense amplifier 302, an output circuit 303, an external integrated circuit 304, power supply lines 305-308 and pads $P_{31}$-$P_{35}$. Also, there are parasitic inductances $L_{31}$-$L_{35}$ and a load capacitance $C_{31}$. In this embodiment, the power supply line 306 provides the necessary substrate potential but, since this line is separate and independent from the power supply line 308 for the output circuit 303, the same advantages as explained for the first embodiment can also be enjoyed.

The invention has been explained with examples wherein in the semiconductor substrate is of a P-type conductivity but the present invention can of course be embodied in a integrated circuit having a substrate of an N-type conductivity.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor integrated circuit having an internal circuit and an output circuit, comprising:
   a set of first power pads and a set of first power supply lines connected to said output circuit, for supplying power to said output circuit;
   a set of second power supply pads and a set of second power supply lines connected to said internal circuit, for supplying power to said internal circuit; and a substrate potential supply pad and a substrate potential supply line commonly connected to said output circuit and said internal circuit, for supplying a substrate potential to said output circuit and said internal circuit, wherein said first power supply pads and said first power supply lines are separate and independent from said second power supply pads and said second power supply lines and also from said substrate potential supply pad and said substrate potential supply line.

2. A semiconductor integrated circuit according to claim 1, in which said second power supply pads and said second power supply lines are separate and independent from said substrate potential supply pad and said substrate potential supply line.

3. A semiconductor integrated circuit according to claim 1, in which one of said second power supply pads and one of said second power supply lines serve as said substrate potential supply pad and said substrate potential supply line respectively.

* * * * *

UNITED STATES PATENT AND TRADEMARK OFFICE
CERTIFICATE OF CORRECTION

PATENT NO. : 5,121,036
DATED : June 9, 1992
INVENTOR(S) : Yukio FUJI

It is certified that error appears in the above-identified patent and that said Letters Patent is hereby corrected as shown below:

Col. 1, line 17, delete "integated" and insert --integrated--;

Col. 3, line 6, delete "circuit 508" and insert --circuit 503--;

Col. 4, line 35, delete "sence" and insert --sense--.

Signed and Sealed this

Twenty-fourth Day of August, 1993

Attest:

BRUCE LEHMAN

Attesting Officer

Commissioner of Patents and Trademarks